(12) United States Patent
Lee

(10) Patent No.: US 10,089,020 B2
(45) Date of Patent: Oct. 2, 2018

(54) MEMORY SYSTEM FOR MULTI-BLOCK ERASE AND OPERATING METHOD THEREOF

(71) Applicant: SK hynix Inc., Gyeonggi-do (KR)

(72) Inventor: Jong-Min Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 13 days.

(21) Appl. No.: 15/406,261

(22) Filed: Jan. 13, 2017

(65) Prior Publication Data

US 2017/0322849 A1 Nov. 9, 2017

(30) Foreign Application Priority Data

May 4, 2016 (KR) .................. 10-2016-0055453

(51) Int. Cl.
*G06F 3/06* (2006.01)
*G06F 12/02* (2006.01)
(Continued)

(52) U.S. Cl.
CPC ............ *G06F 3/0611* (2013.01); *G06F 3/064* (2013.01); *G06F 3/0652* (2013.01);
(Continued)

(58) Field of Classification Search
CPC .. G06F 3/0679; G06F 3/0688; G06F 12/0246; G06F 2212/72–2212/7211; G11C 11/5635; G11C 16/16
See application file for complete search history.

(56) References Cited

U.S. PATENT DOCUMENTS 8,239,614 B2   8/2012  Asnaashari et al.
8,856,475 B1 * 10/2014  Meir .................. G06F 12/0253
                                                711/165

(Continued)

OTHER PUBLICATIONS

Jung et al. "Taking Garbage Collection Overheads off the Critical Path in SSDs." 2012. International Federation for Information Processing. Middleware 2012. pp. 164-186.*

(Continued)

*Primary Examiner* — Nathan Sadler
(74) *Attorney, Agent, or Firm* — IP & T Group LLP

(57) ABSTRACT

A memory system may include a memory device including a plurality of pages which include a plurality of memory cells coupled with a plurality of word lines and are stored with data, a plurality of memory blocks in which the pages are included, a plurality of planes which include the memory blocks, and a plurality of memory dies in which the planes are included; and a controller suitable for performing a program operation corresponding to a write command received from a host, at a first point of time, for first memory blocks among the memory blocks, checking program information for the program operation at the first point of time, predicting erase information on the memory blocks in correspondence to the program information, performing an erase operation for second memory blocks among the memory blocks, at a second point of time after the first point of time, in correspondence to the erase information, and performing the program operation for the second memory blocks at a third point of time after the second point of time.

14 Claims, 9 Drawing Sheets

(51) Int. Cl.
    *G11C 16/16*     (2006.01)
    *G11C 16/10*     (2006.01)
    *G11C 16/14*     (2006.01)
    *G11C 16/34*     (2006.01)
    *G11C 16/32*     (2006.01)

(52) U.S. Cl.
    CPC ........ *G06F 3/0679* (2013.01); *G06F 12/0246* (2013.01); *G11C 16/10* (2013.01); *G11C 16/14* (2013.01); *G11C 16/16* (2013.01); *G11C 16/3495* (2013.01); *G06F 2212/7201* (2013.01); *G06F 2212/7205* (2013.01); *G11C 16/32* (2013.01)

(56) References Cited

U.S. PATENT DOCUMENTS

| | | | |
|---|---|---|---|
| 8,891,300 B2 | 11/2014 | Oh et al. | |
| 9,070,460 B2 | 6/2015 | Yano | |
| 2008/0282024 A1* | 11/2008 | Biswas | G06F 12/0246 711/103 |
| 2011/0022778 A1* | 1/2011 | Schibilla | G06F 12/0246 711/103 |
| 2011/0113187 A1* | 5/2011 | Kashiwagi | G06F 12/0246 711/103 |
| 2011/0161560 A1 | 6/2011 | Hutchison et al. | |
| 2012/0254503 A1* | 10/2012 | Chiu | G06F 3/0619 711/103 |
| 2013/0297855 A1* | 11/2013 | Gupta | G06F 3/0656 711/103 |
| 2015/0212752 A1* | 7/2015 | Nemazie | G06F 11/108 711/103 |
| 2015/0255161 A1* | 9/2015 | Lee | G11C 16/16 365/185.12 |
| 2016/0283401 A1* | 9/2016 | Virajamangala | G06F 12/122 |
| 2017/0068481 A1* | 3/2017 | Yoo | G06F 3/0634 |
| 2018/0011635 A1* | 1/2018 | Shin | G06F 3/0604 |

OTHER PUBLICATIONS

Jeong et al. "A 128 Gb 3b/cell V-NAND Flash Memory With 1 Gb/s I/O Rate." Jan. 2016. IEEE. IEEE Journal of Solid-State Circuits. vol. 51. pp. 204-212.*

* cited by examiner

MEMORY SYSTEM FOR MULTI-BLOCK ERASE AND OPERATING METHOD THEREOF

CROSS-REFERENCE TO RELATED APPLICATION

This U.S. non-provisional patent application claims priority under 35 U.S.C. § 119 to Korean Patent Application No. 10-2016-0055453 filed on May 4, 2016 in the Korean Intellectual Property Office (KIPO), the disclosure of which is incorporated herein by reference in its entirety.

TECHNICAL FIELD

Exemplary embodiments of the present invention relate to a memory system and, more particularly, to a memory system which processes data with respect to a memory device, and an operating method thereof.

DISCUSSION OF THE RELATED ART

The computer environment paradigm has shifted to ubiquitous computing systems that can be used anytime and anywhere. Due to this, use of portable electronic devices such as mobile phones, digital cameras, and notebook computers has rapidly increased. These portable electronic devices generally use a memory system having one or more memory devices for storing data. The memory system may be used as a main memory device or an auxiliary memory device of a portable electronic device.

Memory systems using memory devices provide excellent stability, durability, high information access speed, and low power consumption, since they have no moving parts. Examples of memory systems having such advantages include universal serial bus (USB) memory devices, memory cards having various interfaces, and solid state drives (SSD).

SUMMARY

Various embodiments are directed to a memory system including at least one memory device and an operating method thereof, capable of minimizing complexity and performance deterioration of the memory system and maximizing use efficiency of a memory device employed by the memory system, thereby quickly and stably processing data with respect to the memory device.

In an exemplary embodiment, a memory system may include a memory device including a plurality of pages, each including a plurality of memory cells coupled with a plurality of word lines. The plurality of memory cells are stored with data. Each of a plurality of memory blocks includes the plurality of pages. Each of a plurality of planes includes the plurality of memory blocks. Each of a plurality of memory dies includes the plurality of planes. The memory system may include a controller suitable for: performing a program operation corresponding to a write command, received from a host at a first point of time, onto first memory blocks among the memory blocks; checking program information for the program operation at the first point of time; predicting erase information on the memory blocks in correspondence to the program information; performing an erase operation for second memory blocks among the memory blocks, at a second point of time after the first point of time, in correspondence to the erase information; and performing the program operation for the second memory blocks at a third point of time after the second point of time.

In order to perform the program operation at the third point of time in correspondence to the program information, the controller may predict the second memory blocks for which it is necessary to perform the erase operation, and may record the erase information for the second memory blocks, in a list.

Indexes or identification information of the second memory blocks, which may indicate necessity to perform the erase operation through a multi-block erase operation, are included in the list.

The controller may perform the program operation, through a one-shot program, for pages of super memory blocks which include the memory blocks.

The list may include rows respectively corresponding to the super memory blocks, and bit areas corresponding to memory blocks of the respective super memory blocks, in the rows of the super memory blocks.

The controller may record erase information on respective memory blocks of a first super memory block corresponding to a first row, in the form of a bit map, in a first bit area and a second bit area of the first row of the list.

The program information may include at least one information among positions, checkpoints and checkpoint indexes in the first memory blocks, for segments of data corresponding to the program operation at the first point of time.

The controller may predict at least one of the positions, checkpoints and checkpoint indexes of segments corresponding to the program operation at the third point of time, through the program information.

The controller may predict that at least one of the positions, checkpoints and checkpoint indexes of segments corresponding to the program operation at the first point of time are changed from the first memory blocks to the second memory blocks, through the program operation at the third point of time.

The erase information may include information indicating the erase operation for the second memory blocks, in correspondence to the change from the first memory blocks to the second memory blocks.

In an exemplary embodiment, a method for operating a memory system, may include: performing a program operation corresponding to a write command received from a host, at a first point of time, with respect to first memory blocks among a plurality of memory blocks, for a plurality of pages which are included in the plurality of memory blocks of a memory device and which include a plurality of memory cells coupled to a plurality of word lines; checking program information for the program operation at the first point of time, and predicting erase information on the memory blocks in correspondence to the program information; performing an erase operation for second memory blocks among the memory blocks, at a second point of time next to the first point of time, in correspondence to the erase information; and performing the program operation for the second memory blocks at a third point of time next to the second point of time.

The predicting may include: predicting the second memory blocks for which it is necessary to perform the erase operation, in order to perform the program operation at the third point of time in correspondence to the program information; and recording the erase information for the second memory blocks, in a list.

Indexes or identification information of the second memory blocks, which may indicate necessity to perform the erase operation through a multi-block erase operation, are included in the list.

The program operation may be performed, through a one-shot program, for pages of super memory blocks which include the memory blocks.

The list may include rows respectively corresponding to the super memory blocks, and bit areas corresponding to memory blocks of the respective super memory blocks, in the rows of the super memory blocks.

The recording may record erase information on respective memory blocks of a first super memory block corresponding to a first row, in the form of a bit map, in a first bit area and a second bit area of the first row of the list.

The program information may include at least one information among positions, checkpoints and checkpoint indexes in the first memory blocks, for segments of data corresponding to the program operation at the first point of time.

The predicting may predict at least ones among positions, checkpoints and checkpoint indexes of segments corresponding to the program operation at the third point of time, through the program information.

The predicting may predict that at least one of the positions, checkpoints and checkpoint indexes of segments corresponding to the program operation at the first point of time are changed from the first memory blocks to the second memory blocks, through the program operation at the third point of time.

The erase information may include information indicating the erase operation for the second memory blocks, in correspondence to the change from the first memory blocks to the second memory blocks.

In an exemplary embodiment, a method for operating a memory system may include: providing a memory device and a controller coupled to the memory device, the memory device includes a plurality of memory blocks; performing a program operation with respect to first memory blocks among the plurality of memory blocks; predicting erase information on the plurality of memory blocks in correspondence to program information for the program operation; performing a multi-block erase operation for second memory blocks among the plurality of memory blocks in correspondence to the erase information; and performing the program operation for the second memory blocks, wherein the program information for the program operation includes storage positions and at least one of checkpoints and checkpoint indexes in the first memory blocks, for segments of data corresponding to the program operation.

The segments of data may include data segments of user data, logical to physical (L2P) segments, and the physical to logical (P2L) segments.

The controller predicts the second memory blocks for which it is necessary to perform the multi-block erase operation, and records the erase information for the second memory blocks, in a list.

BRIEF DESCRIPTION OF THE DRAWINGS

These and other features and advantages of the present invention of the present invention will be described in reference to the accompanying drawings, wherein.

DETAILED DESCRIPTION

Figure 1:
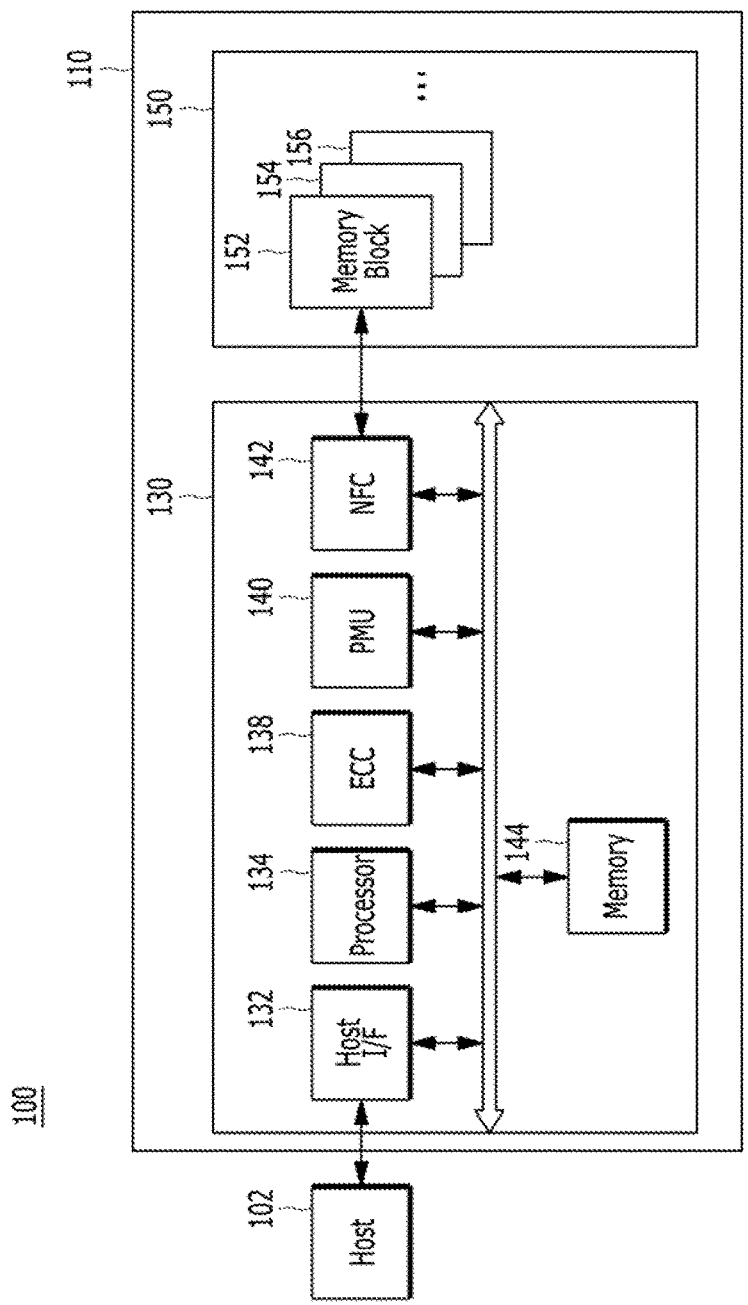
FIG. 1 is a diagram illustrating a data processing system including a memory system, according to an embodiment of the present invention.

Although, various embodiments are described below in more detail with reference to the accompanying drawings, we note that the present invention may, however, be embodied in different forms and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

FIG. 1 illustrates a data processing system 100 including a memory system, according to an embodiment of the present invention.

Referring to FIG. 1, the data processing system 100 may include a host 102 and a memory system 110.

The host 102 may include, for example, a portable electronic device such as a mobile phone, an MP3 player and a laptop computer or an electronic device such as a desktop computer, a game player, a television (TV) and a projector.

The memory system 110 may operate in response to a request from the host 102. For example, the memory system 110 may store data to be accessed by the host 102. The memory system 110 may be used as a main memory or an auxiliary memory of the host 102. The memory system 110 may be implemented with any one of various storage devices, according to the protocol of a host interface to be coupled electrically with the host 102. The memory system 110 may be implemented with any one of various storage devices, such as, for example, a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like.

The storage devices forming the memory system 110 may be implemented with a volatile memory device, such as, a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase-change RAM (PRAM), a magnetoresistive RAM (MRAM), a resistive RAM (RRAM) and a flash memory.

The memory system 110 may include a memory device 150 and a controller 130. The memory device 150 stores data to be accessed by the host 102, and the controller 130 controls data exchange between the memory device 150 and the host 102. That is, under the control of the controller 130, data received from the host may be stored in the memory device 150.

The controller 130 and the memory device 150 may be integrated into one semiconductor device. For instance, the controller 130 and the memory device 150 may be integrated into one semiconductor device to form a solid state drive (SSD). When the memory system 110 is used as the SSD, the operation speed of the host 102 that is electrically coupled with the memory system 110 may be significantly increased.

The controller 130 and the memory device 150 may be integrated into one semiconductor device to form a memory card, such as, for example, a Personal Computer Memory Card International Association (PCMCIA) card, a compact flash (CF) card, a smart media card (SMC), a memory stick, a multimedia card (MMC), an RS-MMC, a micro-MMC, a secure digital (SD) card, a mini-SD, a micro-SD, an SDHC, and a universal flash storage (UFS) device.

For another instance, the memory system 110 may configure a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage for a data center, a device capable of transmitting and receiving information under a wireless environment, one of various electronic devices for a home network, one of various electronic devices for a computer network, one of various electronic devices for a telematics network, an RFID device, or one of various component elements for a computing system.

The memory device 150 may retain stored data even when power is blocked, store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. Each of the pages may include a plurality of memory cells to which a plurality of a word line (WL) are electrically coupled. The memory cells may be single bit cells or multi-bit cells. The memory cells may be arranged in a two or three dimensional stacked structure. The memory device 150 may be a nonvolatile memory device, for example, a flash memory. The flash memory may have a three-dimensional (3D) stack structure. The structure of the memory device 150 and the three-dimensional (3D) stack structure of the memory device 150 will be described later in detail with reference to FIGS. 2 to 11.

The controller 130 of the memory system 110 may control the memory device 150 in response to a request from the host 102. The controller 130 may provide the data read from the memory device 150, to the host 102, and store the data provided from the host 102 into the memory device 150. To this end, the controller 130 may control overall operations of the memory device 150, such as read, write, program, and erase operations.

For example, the controller 130 may include a host interface (I/F) unit 132, a processor 134, an error correction code (ECC) unit 138, a power management unit (PMU) 140, a NAND flash controller (NFC) 142, and a memory 144.

The host interface unit 132 may process commands and data provided from the host 102, and may communicate with the host 102 through at least one of various interface protocols such as universal serial bus (USB), multimedia card (MMC), peripheral component interconnect-express (PCI-E), serial attached SCSI (SAS), serial advanced technology attachment (SATA), parallel advanced technology attachment (PATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, that is, power for the component elements included in the controller 130.

The NFC 142 may serve as a memory interface between the controller 130 and the memory device 150 to allow the controller 130 to control the memory device 150 in response to a request from the host 102. The NFC 142 may generate control signals for the memory device 150 and process data under the control of the processor 134 when the memory device 150 is a flash memory and, in particular, when the memory device 150 is a NAND flash memory.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read, write, program and erase operations.

The memory 144 may be implemented with volatile memory such as a static random access memory (SRAM) or a dynamic random access memory (DRAM). As described above, the memory 144 may store data used by the host 102 and the memory device 150 for the read and write operations. For such storage of the data, the memory 144 may include a program memory, a data memory, a write buffer, a read buffer, a map buffer, and so forth.

The processor 134 may control general operations of the memory system 110, and a write operation or a read operation for the memory device 150, in response to a write request or a read request from the host 102. The processor 134 may drive firmware, which is referred to as a flash translation layer (FTL), to control the general operations of the memory system 110. The processor 134 may be implemented with a microprocessor or a central processing unit (CPU).

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Also, the bad blocks due to the program fail seriously deteriorates the utilization efficiency of the memory device 150 having a 3D stack structure and the reliability of the memory system 100, and thus reliable bad block management is required.

Figure 2:
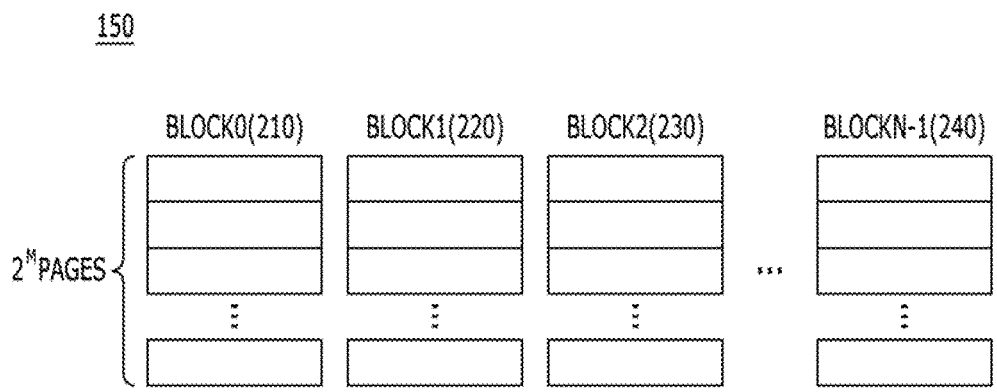
FIG. 2 is a diagram illustrating an example of a memory device employed in the memory system of FIG. 1.

FIG. 2 is a detailed diagram of the memory device 150 shown in FIG. 1.

Referring to FIG. 2, the memory device 150 may include a plurality of memory blocks, for example, a zeroth memory block (BLOCK0) 210, a first memory block (BLOCK1) 220, a second memory block (BLOCK2) 230 and an N−1th memory block (BLOCKN−1) 240. Each of the memory blocks 210 to 240 may include a plurality of pages, for example, $2^M$ number of pages ($2^M$ PAGES). Each of the pages may include a plurality of memory cells to which a plurality of word lines are electrically coupled.

Also, the memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may be defined as a triple level cell (TLC) memory block.

Each of the memory blocks 210 to 240 may store the data provided from the host 102 during a write operation, and provide the stored data to the host 102 during a read operation.

Figure 3:
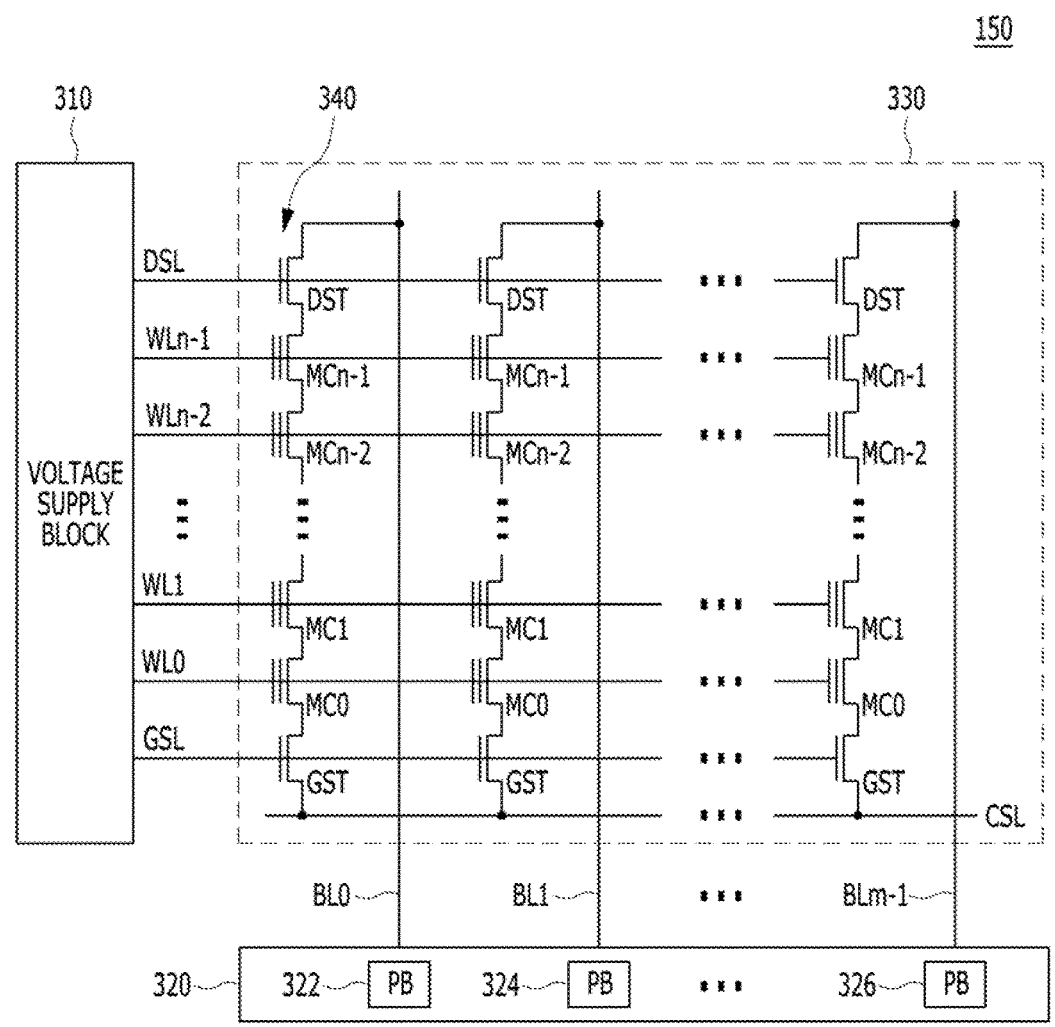
FIG. 3 is a circuit diagram illustrating a memory block in a memory device, according to an embodiment of the present invention.

FIG. 3 is a diagram illustrating a memory device 150 including the memory block shown in FIG. 2. FIG. 3 shows a detailed configuration of a single memory block 330 and circuits related thereto 310 and 320.

Referring to FIG. 3, the memory block 330 may include a plurality of cell strings 340 which are electrically coupled to bit lines BL0 to BLm−1, respectively. The cell string 340 of each column may include at least one drain select transistor (i.e., string select transistor) DST and at least one ground select transistor (i.e., source select transistor) GST. A plurality of memory cell transistors MC0 to MCn−1 may be electrically coupled in series between the select transistors GST and DST. The respective memory cells MC0 to MCn−1 may be configured by multi-level cells (MLC) each of which stores data information of a plurality of bits. The cell strings 340 may be electrically coupled to the corresponding bit lines BL0 to BLm−1, respectively. For reference, in FIG. 3, 'DSL' denotes a drain select line (i.e., a string select line), 'GSL' denotes a ground select line (i.e., a source select line), and 'CSL' denotes a common source line.

While FIG. 3 shows, as an example, the memory block 330 which is configured by NAND flash memory cells, it is to be noted that the memory block 330 of the memory device 300 according to an exemplary embodiment of the present invention is not limited to NAND flash memory and may be realized by NOR flash memory, hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A voltage supply block 310 of the memory device 300 may provide word line voltages, for example, a program voltage, a read voltage and a pass voltage, to be supplied to respective word lines according to an operation mode and voltages to be supplied to bulks, for example, well regions, where the memory cells are formed. The voltage supply block 310 may perform a voltage generating operation under the control of a control circuit (not shown). The voltage supply block 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read/write circuit 320 of the memory device 300 may be controlled by the control circuit, and may serve as a sense amplifier or a write driver according to an operation mode. During a verification/normal read operation, the read/write circuit 320 may serve as a sense amplifier for reading data from the memory cell array. Also, during a program operation, the read/write circuit 320 may serve as a write driver which drives bit lines according to data to be stored in the memory cell array. The read/write circuit 320 may receive data to be written in the memory cell array, from a buffer (not shown), during the program operation, and may drive the bit lines according to the inputted data. To this end, the read/write circuit 320 may include a plurality of page buffers 322, 324 and 326 respectively corresponding to columns (or bit lines) or pairs of columns (or pairs of bit lines), and a plurality of latches (not shown) may be included in each of the page buffers 322, 324 and 326.

The memory device 150 may be realized as a 2-dimensional or 3-dimensional memory device. For example, as shown in FIG. 4, in the case where the memory device 150 is realized as a 3-dimensional nonvolatile memory device, the memory device 150 may include a plurality of memory blocks BLK0 to BLKN−1.

Figure 4:
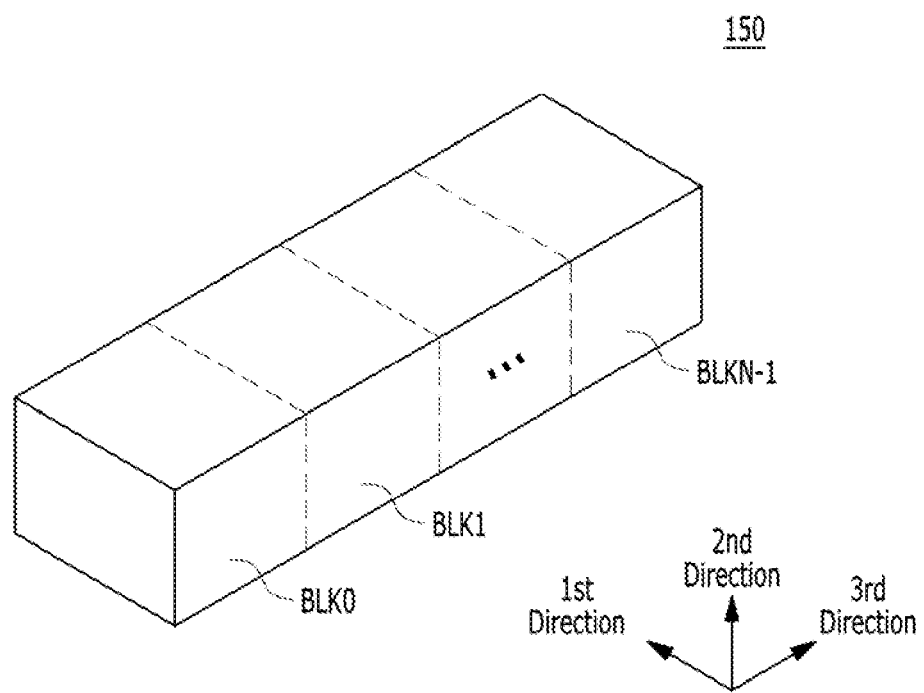
FIG. 4 is a diagram schematically illustrating an example configuration of a memory device, according to an embodiment of the present invention.

FIG. 4 is a block diagram illustrating the memory blocks of the memory device shown in FIG. 3, and the memory blocks BLK0 to BLKN−1 may be realized as a 3-dimensional structure (or a vertical structure). For example, the respective memory blocks BLK0 to BLKN−1 may be realized as a 3-dimensional structure by including a structure which extends in first to third directions (for example, the x-axis direction, the y-axis direction and the z-axis direction).

The respective memory blocks BLK0 to BLKN−1 may include a plurality of NAND strings extending in the second direction. The plurality of NAND strings may be provided in the first direction and the third direction. Each NAND string may be electrically coupled to a bit line, at least one drain select line, at least one ground select line, a plurality of word lines, at least one dummy word line, and a common source line. Namely, the respective memory blocks BLK0 to BLKN−1 may be electrically coupled to a plurality of bit lines, a plurality of drain select lines, a plurality of ground select lines, a plurality of word lines, a plurality of dummy word lines, and a plurality of common source lines.

Hereinbelow, detailed descriptions will be made with reference to FIGS. 5 and 6, for data processing with respect to a memory device 150 in a memory system 110, according to an embodiment, particularly, a data processing operation with respect to the memory device 150 corresponding to a command received from the host 102.

Figure 5:
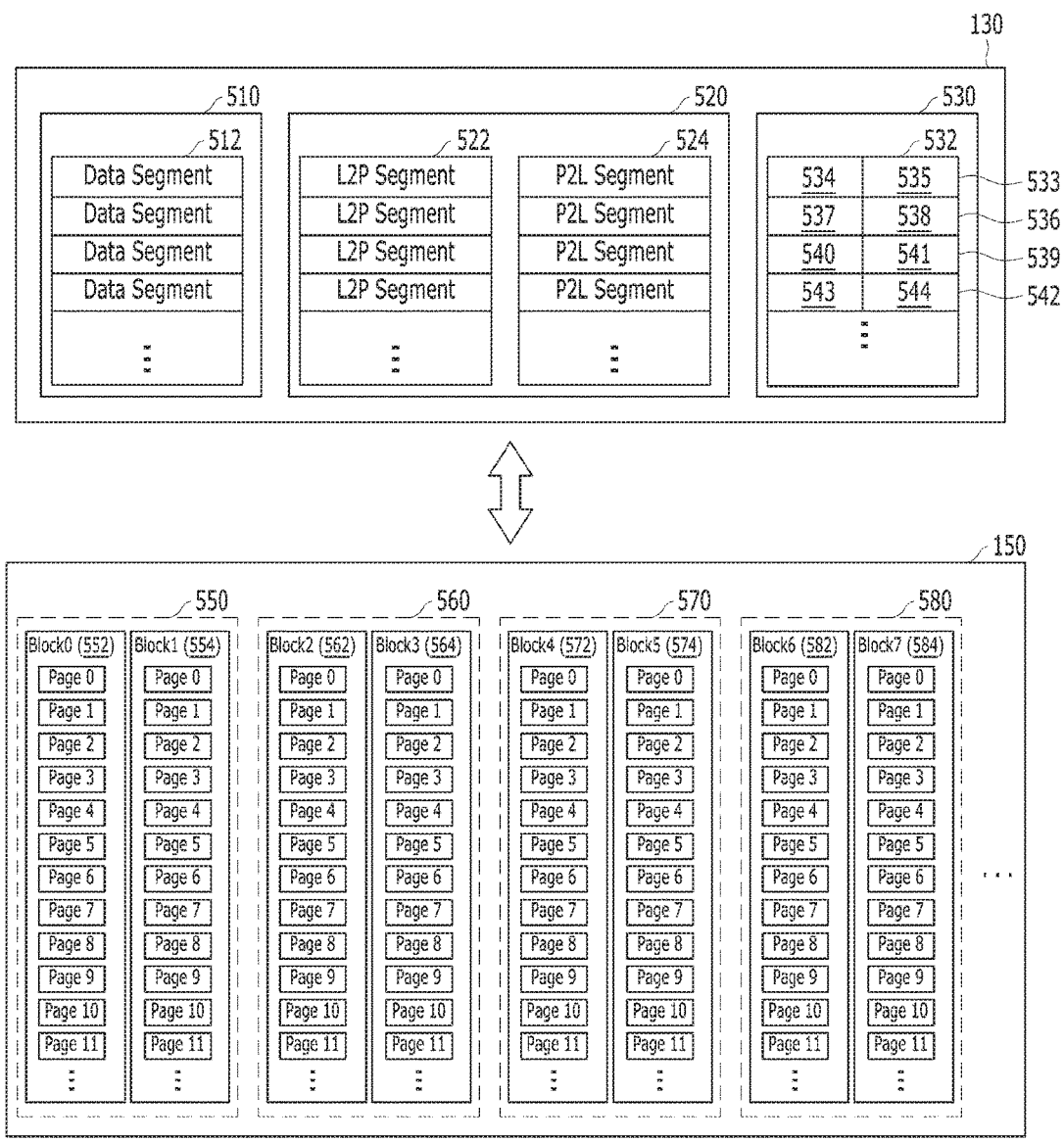
FIG. 5 is a schematic diagram to assist in the explanation of a data processing operation with respect to a memory device in a memory system, according to an embodiment of the present invention.

FIG. 5 is a schematic diagram schematically illustrating a data processing operation with respect to a memory device 150 in a memory system 110, according to an embodiment of the present invention. In the present embodiment, it is described as an example, that data corresponding to a command (hereinafter also referred to as command data), for example, write data corresponding to a write command which are received from the host 102 in the memory system 110 shown in FIG. 1, may be stored in a buffer/cache included in the memory 144 of the controller 130. Also, the data stored in the buffer/cache may be written in one or more memory blocks among the plurality of memory blocks included in the memory device 150. In this way, a command operation for the command data, for example, a write operation (also referred to as a program operation) for a write command, corresponding to the command received from the host 102 may be performed.

Further, while, in the present embodiment, it will be described below as an example for the sake of convenience in explanation that the controller 130 performs a data processing operation in the memory system 110, it is noted that, as described above, the processor 134 included in the controller 130 may perform data processing through, for example, a flash translation layer (FTL). Moreover, in the present embodiment, after storing user data and metadata corresponding to a write command received from the host 102, in the buffer included in the memory 144 of the controller 130, the controller 130 performs the program operation including writing and storing the data stored in the buffer, in one or more memory blocks among the plurality of memory blocks included in the memory device 150.

The metadata may include all information and data corresponding to the command received from the host 102 excluding the user data. For example, the metadata may include first map data including a logical/physical (L2P: logical to physical) information (hereinafter, referred to simply as a 'logical information') and second map data including a physical/logical (P2L: physical to logical) information (hereinafter, referred to simply as a 'physical information'), for the data stored in the memory blocks which correspond to the program operation. The metadata may include an information on the command data corresponding to the command received from the host 102, an information on the command operation corresponding to the command, an information on the memory blocks of the memory device 150 for which the command operation is to be performed, and an information on map data and so forth in correspondence to the command operation.

In an embodiment of the present disclosure, in the case where the controller 130 receives a command, for example, a write command, from the host 102, user data corresponding to the write command are written and stored in memory blocks of the memory device 150, for example, open memory blocks for which an erase operation is performed or free memory blocks among the memory blocks. Any metadata are written and stored in the open memory blocks or the free memory blocks among the memory blocks of the memory device 150. The metadata may include any mapping information between logical addresses and physical addresses for the user data stored in the memory blocks, that is, first map data including an L2P map table in which logical information are recorded, and any mapping information between physical addresses and logical addresses for the memory blocks in which the user data are stored, that is, second map data including a P2L map table in which physical information are recorded. In particular, when the write command is received from the host 102, the user data corresponding to the write command are written and stored in the memory blocks, and metadata including the first map data and the second map data for the user data stored in the memory blocks and so forth are stored in the memory blocks.

For example, data segments of the user data and meta segments of the metadata, that is, L2P segments of the first map data and P2L segments of the second map data as map segments of map data, are stored in the memory blocks of the memory device 150.

In an embodiment, the memory device 150 may include a plurality of memory dies, each of the memory dies may include a plurality of planes, each of the planes may include a plurality of memory blocks (for example memory blocks 152, 154 and 156 shown in FIG. 1), and each of the memory blocks may include a plurality of pages (as described for example above with reference to FIG. 2.) The user data and the metadata of a command operation corresponding to a command received from the host 102 may be written and stored in the memory blocks. In particular, the user data and the metadata may be written and stored in super memory blocks through a one-shot program.

Each super memory block may include a plurality of memory blocks, for example, a first memory block and a second memory block.

In a super memory block including a first memory block and a second memory block, the first and second memory blocks may be different memory blocks included in the same plane of a same memory die among the plurality of memory dies, for example, the first and second memory blocks may be different memory blocks included in a first plane of a first memory die among a plurality of memory dies.

In a super memory block including a first memory block and a second memory block, the first memory block may be a memory block in a first plane of a first memory die, whereas the second memory block may be a memory block included in a second plane of the first memory die.

In a super memory block including a first memory block and a second memory block, the first memory block may be a memory block in a first plane of a first memory die, whereas the second memory block may be a memory block included in any one of a plurality of planes of a second memory die among the plurality of memory dies.

In an embodiment, a super memory block may include a first memory block included in a first plane of a first memory die and a second memory block, wherein the second memory block may be: i) a memory block which is included in the same memory die and the same plane as the first memory block, ii) a memory block which is included in a different plane in the same memory die as the first memory block, or iii) a memory block which is included in a memory die different from the memory die of the first memory block.

While it is described herein as an example that each super memory block includes 2 memory blocks, it is to be noted that each super memory block may include a plurality of memory blocks the number of which is equal to or larger than 2. As described above, the memory blocks of each super memory block may be memory blocks which are included in the same plane of the same memory die, memory blocks which are included in different planes of the same memory die, or memory blocks which are included in different memory dies.

In an embodiment of the present disclosure, a command operation corresponding to a write command received from the host 102 may include writing and storing data segments of user data and meta segments of metadata in super memory blocks, each super memory block including a first memory block and a second memory block, through a one-shot program. In this regard, in order to perform the command operation corresponding to the write command received from the host 102, an erase operation is performed for the memory blocks included in the memory device 150. The erase operation is performed for the super memory blocks each including a plurality of memory blocks, for example, the first memory block and the second memory block, in particular, through a multi-block erase operation, and then, the data segments and the meta segments are written and stored in the super memory blocks. Hereinbelow, descriptions will be made for an operation of processing data by performing an erase operation for the memory device 150 and then performing the command operation corresponding to the write command received from the host 102, to perform data processing in the memory system according to an embodiment of the present disclosure. For example, the command operation may be a write operation corresponding to a write command.

Referring to FIG. 5, the controller 130 writes and stores data corresponding to a command received from the host 102, for example, user data corresponding to a write command, in open memory blocks among a plurality of memory blocks 552, 554, 562, 564, 572, 574, 582 and 584 of super memory blocks of the memory device 150, for example, a first super memory block 550, a second super memory block 560, a third super memory block 570 and a fourth super memory block 580, and in correspondence to the operation of writing the user data, writes and stores map data for the user data, in the open memory blocks among the plurality of memory blocks 552, 554, 562, 564, 572, 574, 582 and 584 of the first super memory block 550, the second super memory block 560, the third super memory block 570 and the fourth super memory block 580 of the memory device 150.

As aforementioned above, the memory device 150 may include a plurality of memory dies, each of the memory dies may include a plurality of planes, and each of the planes may include a plurality of memory blocks. Each of the super memory blocks, that is, the first super memory block 550, the second super memory block 560, the third super memory block 570 and the fourth super memory block 580 may include memory blocks included in a plurality of memory dies or a plurality of planes in the memory device 150, for example, a first memory block and a second memory block. Each of the super memory blocks 550, 560, 570 and 580 of the memory device 150 may include not only the first memory block and the second memory block as described above but also a larger number of memory blocks. In the embodiment of the present disclosure, for the sake of convenience in explanation, each of the super memory blocks 550, 560, 570 and 580 of the memory device 150 includes two memory blocks, that is, the first memory block and the second memory block.

Therefore, the first super memory block 550 includes a block0 552 as the first memory block and a block1 554 as the second memory block, the second super memory block 560 includes a block2 562 as the first memory block and a block3 564 as the second memory block, the third super memory block 570 includes a block4 572 as the first memory block and a block5 574 as the second memory block, and the fourth super memory block 580 includes a block6 582 as the first memory block and a block7 584 as the second memory block. In the case where the first memory blocks respectively included in the first super memory block 550, the second super memory block 560, the third super memory block 570 and the fourth super memory block 580, that is, the block0 552, the block2 562, the block4 572 and the block6 582 are memory blocks which are included in a first plane of a first memory die among the memory dies of the memory device 150, the second memory blocks respectively included in the first super memory block 550, the second super memory block 560, the third super memory block 570 and the fourth super memory block 580, that is, the block1 554, the block3 564, the block5 574 and the block7 584 may be memory blocks which are different from the first memory blocks and may be included in the first plane of the first memory die in the memory device 150, or memory blocks which are included in a second plane of the first memory die, or memory blocks which are included in a plane of a second memory die in the memory device 150.

The first memory blocks and the second memory blocks of the first super memory block 550, the second super memory block 560, the third super memory block 570 and the fourth super memory block 580 may be different memory blocks which are included in the same plane of the same memory die, or different memory blocks which are included in different planes of the same memory die, or different memory blocks which are included in different memory dies. Hereinbelow, it will be described in detail as an example, for the sake of convenience in explanation, that the first memory blocks respectively included in the first super memory block 550, the second super memory block 560, the third super memory block 570 and the fourth super memory block 580, that is, the block0 552, the block2 562, the block4 572 and the block6 582 are memory blocks which are included in the first plane of the first memory die in the memory device 150, and the second memory blocks respectively included in the first super memory block 550, the second super memory block 560, the third super memory block 570 and the fourth super memory block 580, that is, the block1 554, the block3 564, the block5 574 and the block7 584 are memory blocks which are included in the second plane of the first memory die in the memory device 150.

The controller 130 stores data segments 512 of data corresponding to a command received from the host 102, for example, user data corresponding to a write command, in a first buffer 510 as a data buffer/cache, and then, stores the data segments 512 stored in the first buffer 510, in the memory blocks of the memory device 150, in particular, writes and stores the data segments 512 stored in the first buffer 510, in pages included in the first memory blocks and the second memory blocks of the super memory blocks 550, 560, 570 and 580, through a one-shot program.

As the data segments 512 of the user data corresponding to the command received from the host 102 are written and stored in the pages included in the first memory blocks and the second memory blocks of the super memory blocks 550, 560, 570 and 580, the controller 130 generates first map data and second map data, and stores the first map data and the second map data in a second buffer 520 included in the memory 144 of the controller 130, that is, stores L2P segments 522 of the first map data for the user data and P2L segments 524 of the second map data for the user data, in the second buffer 520 as a map buffer/cache. The controller 130 may store meta segments of metadata including the L2P segments 522 of the first map data and the P2L segments 524 of the second map data, in the second buffer 520. The metadata stored in the second buffer 520 may include, as described above, an information on command data corresponding to a command received from the host 102, for example, a command data information, an information on a command operation corresponding to the command, for example, a command operation information, an information on memory blocks of the memory device 150 for which the command operation is to be performed, for example, a memory block information, and map data corresponding to the command operation, for example, first map data and second map data.

The controller 130 writes and stores the L2P segments 522 of the first map data and the P2L segments 524 of the second map data stored in the second buffer 520, in the pages included in the memory blocks of the memory device 150, in particular, writes and stores the L2P segments 522 of the first map data and the P2L segments 524 of the second map data stored in the second buffer 520, in the pages included in the first memory blocks and the second memory blocks of the super memory blocks 550, 560, 570 and 580, through a one-shot program.

For example, the controller 130 writes and stores the data segments 512 of the user data stored in the first buffer 510, in the pages included in the memory blocks of the memory device 150, for example, the block0 552 and the block1 554 of the first super memory block 550. Also, in correspondence to the fact that the data segments 512 of the user data are stored in the pages included in the block0 552 and the block1 554 of the first super memory block 550, the controller 130 writes and stores the L2P segments 522 of the first map data and the P2L segments 524 of the second map data stored in the second buffer 520, in the pages included in the memory blocks of the memory device 150, for example, the pages included in the block0 552 and the block1 554 of the first super memory block 550 or the pages included in the block4 572 and the block5 574 of the third super memory block 570.

For instance, at a certain point of time t1, the controller 130 writes and stores the data segments 512 of user data in a page 0 and a page 1 of the block0 552 and the block1 554 of the first super memory block 550, through a one-shot program. Further, in correspondence to the fact that the data segments 512 are stored in the page 0 and the page 1 of the block0 552 and the block1 554 of the first super memory block 550, the controller 130 stores the L2P segments 522 of first map data and the P2L segments 524 of second map data in the same memory blocks as the data segments 512 or in memory blocks in which metadata including the first map data and the second map data are stored. In other words, the controller 130 writes and stores the L2P segments 522 of the first map data and the P2L segments 524 of the second map data in the memory blocks in which the data segments 512 are stored, that is, a page 2 and a page 3 of the block0 552 and the block1 554 of the first super memory block 550, through a one-shot program, or writes and stores the L2P segments 522 of the first map data and the P2L segments 524 of the second map data in the memory blocks in which the metadata are stored, that is, a page 0 and a page 1 of the block2 562 and the block3 564 of the second super memory block 560, through a one-shot program.

In correspondence to the storage of the data segments 512 and the L2P segments 522 and the P2L segments 524, at the point of time t1, the controller 130 checks program information on the memory blocks of the memory device 150. The program information may include positions where the data segments 512 are stored, positions where the L2P segments 522 of the first map data and the P2L segments 524 of the second map data are stored, checkpoints or checkpoint indexes of the data segments 512, and checkpoints or checkpoint indexes of the L2P segments 522 and the P2L segments 524, in the memory blocks of the memory device 150 in which the data segments 512 and the L2P segments 522 and the P2L segments 524 are stored.

That is to say, after completing a command operation corresponding to a write command received from the host 102, the controller 130, at the time point t1 may check the program information on the memory blocks of the memory device 150 in correspondence to the command operation, that is, the storage positions of the data segments 512, the storage positions of the L2P segments 522 and the P2L segments 524, the checkpoints of the data segments 512 and the L2P segments 522 and the P2L segments 524 and the checkpoint indexes of the data segments 512 and the L2P segments 522 and the P2L segments 524.

In the case of storing the data segments 512 stored in the first buffer 510 and the L2P segments 522 and the P2L segments 524 stored in the second buffer 520, in the memory blocks of the memory device 150, at a point of time t3 after the point of time t1, the controller 130 predicts information of the program information checked at the point of time t1, that is, program information on the memory blocks of the memory device 150 at the point of time t3. In correspondence to storage of the data segments 512 and the L2P segments 522 and the P2L segments 524 at the point of time t3, the controller 130 predicts the update information on the storage positions of the data segments 512, the storage positions of the L2P segments 522 and the P2L segments 524, the checkpoints of the data segments 512 and the L2P segments 522 and the P2L segments 524 and the checkpoint indexes of the data segments 512 and the L2P segments 522 and the P2L segments 524, at the previous point of time t1.

The controller 130 predicts, according to the update information, memory blocks for which it is necessary to perform an erase operation to store the data segments 512 and the L2P segments 522 and the P2L segments 524 at the point of time t3, records information indicating the memory blocks for which it is necessary to perform an erase operation, in a list 532, and stores the list 532 in a third buffer 530 which is included in the memory 144 of the controller 130. Erase information on the memory blocks for which it is necessary to perform an erase operation, among the memory blocks of the memory device 150, are included in the list 532 in the form of a bit map. Respective rows 533, 536, 539 and 542 in the list 532 correspond to the super memory blocks 550, 560, 570 and 580 of the memory device 150, and bit areas in the respective rows 533, 536, 539 and 542 may be recorded with erase information on the first memory blocks and the second memory blocks included in the super memory blocks 550, 560, 570 and 580. Also, in the list 532, indexes or identification information of memory blocks may be recorded as information indicating memory blocks for which it is necessary to perform an erase operation.

For example, the controller 130 predicts memory blocks for which it is necessary to perform an erase operation, among the memory blocks of the memory device 150, to perform a command operation corresponding to a write command received from the host 102, that is, a program operation, at the point of time t3. In the case where it is necessary to perform an erase operation for the block0 552 and the block1 554 of the first super memory block 550 in the memory device 150, erase information is recorded in a first bit area 534 and a second bit area 535 of the first row 533 in the list 532. In the case where it is necessary to perform an erase operation for the block2 562 and the block3 564 of the second super memory block 560 in the memory device 150, erase information is recorded in a first bit area 537 and a second bit area 538 of the second row 536 in the list 532. In the case where it is necessary to perform an erase operation for the block4 572 and the block5 574 of the third super memory block 570 in the memory device 150, erase information is recorded in a first bit area 540 and a second bit area 541 of the third row 539 in the list 532. In the case where it is necessary to perform an erase operation for the block6 582 and the block7 584 of the fourth super memory block 580 in the memory device 150, erase information is recorded in a first bit area 543 and a second bit area 544 of the fourth row 542 in the list 532.

After recording at the time point t1, as described above, erase information in the list 532, before performing at the point of time t3 the command operation corresponding to the write command received from the host 102, the controller 130 performs, at a time point t2, an erase operation for the memory blocks recorded in the list 532, through a multi-block erase operation. Then, at the point of time t3, the controller 130 performs the command operation corresponding to the write command received from the host 102, in the memory blocks for which the erase operation has been performed in advance.

Namely, after performing, the command operation corresponding to the write command received from the host 102, the controller 130 at the point of time t1, checks program information on the memory blocks of the memory device 150 corresponding to the command operation. In the case of performing, at the point of time t3 after the point of time t1, the command operation corresponding to the write command received from the host 102, the controller 130 predicts update information for the program information at the point of time t1. In order to perform, at the point of time t3, the command operation corresponding to the write command received from the host 102, according to the update information, the controller 130 predicts memory blocks for which it is necessary to perform an erase operation, among the memory blocks of the memory device 150, and records erase information on memory blocks, in the list 532. The controller 130 performs, at the point of time t2 before the point of time t3, the erase operation for the memory blocks of the memory device 150 through the multi-block erase operation in correspondence to the erase information recorded in the list 532, and performs, at the point of time t3 after the point of time t2, the command operation corresponding to the write command received from the host 102, for the memory blocks for which the erase operation has been performed.

For instance, as described above, the controller 130 stores the data segments 512 stored in the first buffer 510, in the pages included in the block0 552 and the block1 554 of the first super memory block 550, and stores the L2P segments 522 and the P2L segments 524 stored in the second buffer 520, in the pages included in the block0 552 and the block1 554 of the first super memory block 550 or the pages included in the block1 562 and the block3 564 of the second super memory block 560. After checking the program information on the memory blocks of the memory device 150 at the point of time t1, the controller 130 predicts update information for the program information at the point of time t3. That is to say, in the case of storing, at the point of time t3, the data segments 512 stored in the first buffer 510 and the L2P segments 522 and the P2L segments 524 stored in the second buffer 520, in the memory blocks of the memory device 150, the controller 130 predicts the program information on the memory blocks of the memory device 150 at the point of time t3.

The controller 130 checks the program information on the memory blocks of the memory device 150 at the point of time t1, that is, the storage positions of the data segments 512, the storage positions of the L2P segments 522 and the P2L segments 524, the checkpoints of the data segments 512 and the L2P segments 522 and the P2L segments 524 and the checkpoint indexes of the data segments 512 and the L2P segments 522 and the P2L segments 524, as the block0 552 and the block1 554 of the first super memory block 550 and the block2 562 and the block3 564 of the second super memory block 560. Also, the controller 130 predicts program information on the memory blocks of the memory device 150 at the point of time t3, that is, the storage positions of the data segments 512, the storage positions of the L2P segments 522 and the P2L segments 524, the checkpoints of the data segments 512 and the L2P segments 522 and the P2L segments 524 and the checkpoint indexes of the data segments 512 and the L2P segments 522 and the P2L segments 524, as the block4 572 and the block5 574 of the third super memory block 570 and the block6 582 and the block7 584 of the fourth super memory block 580.

In particular, in the case where it is checked through the program information on the memory blocks of the memory device 150 at the point of time t1 that, in the block0 552 and the block1 554 of the first super memory block 550 and the block1 562 and the block3 564 of the second super memory block 560, the size of pages for which a program operation can be performed is smaller than a program operation size, the controller 130 predicts the program information at the point of time t3, as the block4 572 and the block5 574 of the third super memory block 570 and the block6 582 and the block7 584 of the fourth super memory block 580. For example, in the case where the controller 130 performs the program operation for the memory blocks of the memory device 150 through one-shot program in correspondence to the write command received from the host 102, the size of the one-shot program is 64K and it is checked through the program information at the point of time t1 that the size of pages which can be programmed in the block0 552 and the block1 554 of the first super memory block 550 and the block1 562 and the block3 564 of the second super memory block 560 is 32K, the controller 130 predicts the program information at the point of time t3, as the block4 572 and the block5 574 of the third super memory block 570 and the block6 582 and the block7 584 of the fourth super memory block 580.

In order to perform, at the point of time t3, the command operation corresponding to the write command received from the host 102, the controller 130 predicts the block4 572 and the block5 574 of the third super memory block 570 and the block6 582 and the block7 584 of the fourth super memory block 580, as memory blocks for which it is necessary to perform an erase operation, and records erase information on the block4 572 and the block5 574 of the third super memory block 570 and the block6 582 and the block7 584 of the fourth super memory block 580, in the list 532.

Moreover, the controller 130 performs an erase operation for the memory blocks of the memory device 150 in correspondence to the erase information recorded in the list 532, at the point of time t2 before the point of time t3. That is to say, the controller 130 performs an erase operation for the block4 572 and the block5 574 of the third super memory block 570 and the block6 582 and the block7 584 of the fourth super memory block 580, through a multi-block erase operation. Then, the controller 130 performs the command operation corresponding to the write command received from the host 102 at the point of time t3 next the point of time t2, that is, stores the data segments 512 stored in the first buffer 510, in the pages included in the block4 572 and the block5 574 of the third super memory block 570, and stores the L2P segments 522 and the P2L segments 524 stored in the second buffer 520, in the pages included in the block4 572 and the block5 574 of the third super memory block 570 or the pages included in the block6 582 and the block7 584 of the fourth super memory block 580.

Therefore, in the memory system according to the embodiment, after performing a program operation corresponding to a write command received from the host 102, in the memory blocks included in the memory device 150, memory blocks in the case of performing a next program operation are predicted by checking program information on the memory blocks, and, in the case where it is necessary to perform an erase operation for the predicted memory blocks, the erase operation is performed through a multi-block erase operation, whereby a program operation corresponding to a write command received next from the host 102 may be quickly performed. Hereinbelow, operations for processing data in the memory system according to the embodiment will be described in detail with reference to FIG. 6.

Figure 6:
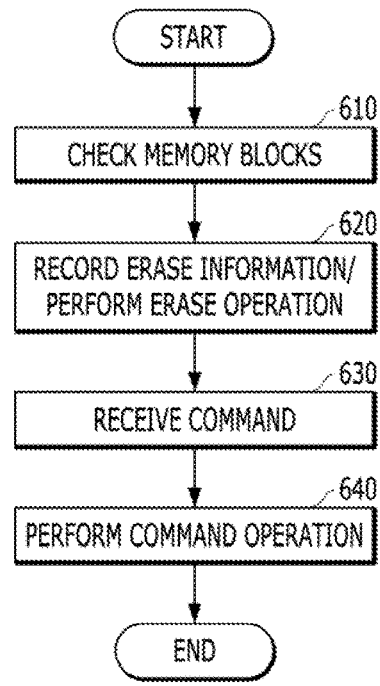
FIG. 6 is a flow chart illustrating a data processing operation in a memory system, according to an embodiment of the present invention.

FIG. 6 is a representation of an example of a schematic flow chart illustrating a data processing operation in a memory system according to an embodiment of the present invention.

Referring to FIG. 6, at step 610, checks program information on the memory blocks of the memory device by checking the memory blocks in which data are stored. The program information include metadata. As described above, the memory system 110 may perform a program operation corresponding to a command, for example, a write command, received from the host 102, for a plurality of memory blocks included in a memory device, that is may store data in a plurality of pages included in a super memory block of the memory device, through a one-shot program, and updates program information on the memory blocks of the memory device in which the data are stored.

At step 620, the memory system records erase information and performs an erase operation for memory blocks for which it is necessary an erase operation. More specifically, the memory system 110 may predict through the program information, memory blocks for which it is necessary to perform an erase operation, records in a list erase information on the memory blocks for which it is necessary to perform an erase operation, and performs an erase operation for the memory blocks of the memory device corresponding to the erase information recorded in the list.

Then, at step 630, a command, for example, a write command is received from the host 102, and at step 640, a command operation, that is, a program operation, corresponding to the write command is performed for the memory blocks for which the erase operation has been performed, among the memory blocks of the memory device.

Since detailed descriptions were made above with reference to FIG. 5, for performance of a program operation corresponding to a command, for example, a write command, received from a host, in particular, a one-shot program for the pages included in super memory blocks of a memory device, prediction of memory blocks for which it is necessary to perform an erase operation in correspondence to the program operation, among memory blocks, recording of erase information, performance of the erase operation for the memory blocks corresponding to the erase information, and performance of a program operation in the memory blocks for which the erase operation has been performed, further descriptions thereof will be omitted herein.

Hereinbelow, detailed descriptions will be made with reference to FIGS. 7 to 12, for a data processing system and electronic appliances to which the memory system 110 including the memory device 150 and the controller 130 described above with reference to FIGS. 1 to 6, according to the embodiment, is applied.

Figure 7:
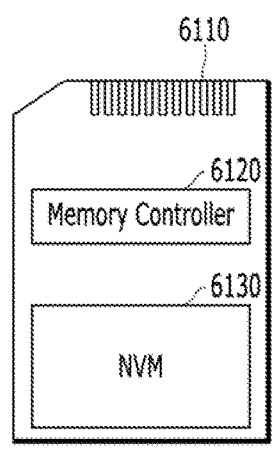
FIGS. 7 to 12 are diagrams schematically illustrating memory systems, according to embodiments of the present invention.

FIG. 7 is a diagram illustrating a data processing system including the memory system according to the embodiment. FIG. 7 is a drawing schematically illustrating a memory card system to which the memory system according to an embodiment is applied.

Referring to FIG. 7, a memory card system 6100 includes a memory controller 6120, a memory device 6130, and a connector 6110.

In detail, the memory controller 6120 may be connected with the memory device 6130 and may access the memory device 6130. In some embodiments, the memory device 6130 may be implemented with a nonvolatile memory (NVM). For example, the memory controller 6120 may control read, write, erase and background operations for the memory device 6130. The memory controller 6120 may provide an interface between the memory device 6130 and a host (not shown), and may drive a firmware for controlling the memory device 6130. For example, the memory controller 6120 may correspond to the controller 130 in the memory system 110 described above with reference to FIG. 1, and the memory device 6130 may correspond to the memory device 150 in the memory system 110 described above with reference to FIG. 1.

Therefore, the memory controller 6120 may include components such as a random access memory (RAM), a processing unit, a host interface, a memory interface and an error correction unit as shown in FIG. 1.

The memory controller 6120 may communicate with an external device (for example, the host 102 described above with reference to FIG. 1), through the connector 6110. For example, as described above with reference to FIG. 1, the memory controller 6120 may be configured to communicate with the external device through at least one of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (ESDI), Integrated Drive Electronics (IDE), Firewire, universal flash storage (UFS), wireless-fidelity (WI-FI) and Bluetooth. Accordingly, the memory system and the data processing system according to the embodiment may be applied to wired/wireless electronic appliances, For example, a mobile electronic appliance.

The memory device 6130 may be implemented with a nonvolatile memory. For example, the memory device 6130 may be implemented with various nonvolatile memory devices such as an electrically erasable and programmable ROM (EPROM), a NAND flash memory, a NOR flash memory, a phase-change RAM (PRAM), a resistive RAM (ReRAM), a ferroelectric RAM (FRAM) and a spin torque transfer magnetic RAM (STT-MRAM).

The memory controller 6120 and the memory device 6130 may be integrated into a single semiconductor device. For example, the memory controller 6120 and the memory device 6130 may construct a solid state driver (SSD) by being integrated into a single semiconductor device. The memory controller 6120 and the memory device 6130 may construct a memory card such as a PC card (PCMCIA: Personal Computer Memory Card International Association), a compact flash card (CF), a smart media card (SM and SMC), a memory stick, a multimedia card (MMC, RS-MMC, MMCmicro and eMMC), an SD card (e.g., SD, miniSD, microSD and SDHC) and a universal flash storage (UFS).

Figure 8:
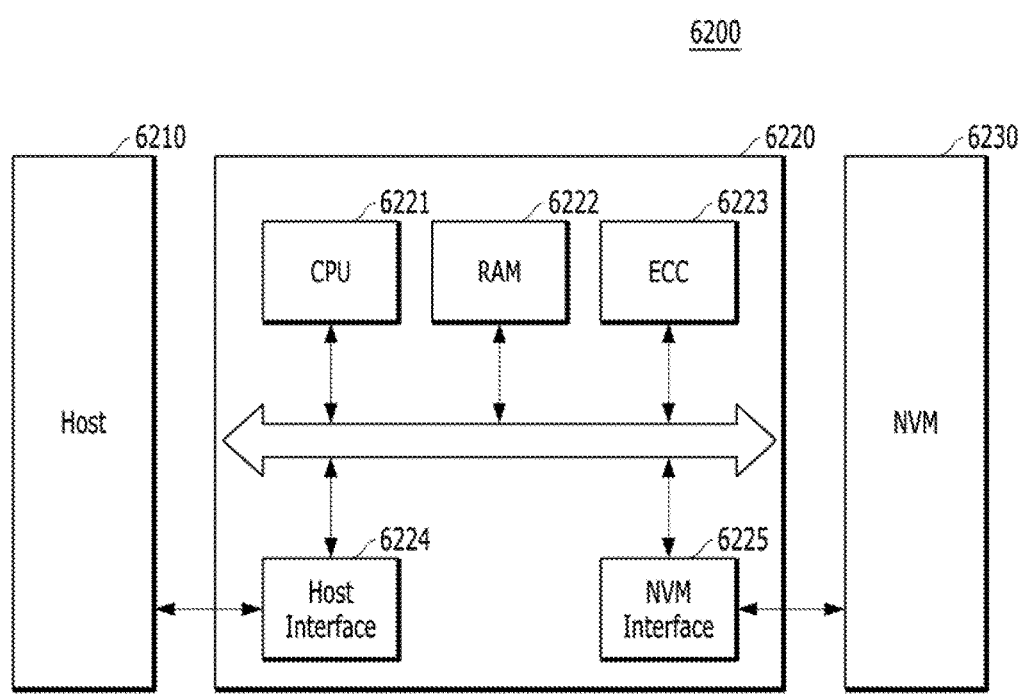

FIG. 8 is a diagram schematically illustrating an example of a data processing system including a memory system according to an embodiment of the present invention.

Referring to FIG. 8, a data processing system 6200 includes a memory device 6230 which may be implemented with at least one nonvolatile memory (NVM) and a memory controller 6220 for controlling the memory device 6230. The data processing system 6200 may be a storage medium such as a memory card (e.g., CF, SD and microSD), as described above with reference to FIG. 1. The memory device 6230 may correspond to the memory device 150 in the memory system 110 described above with reference to FIG. 1, and the memory controller 6220 may correspond to the controller 130 in the memory system 110 described above with reference to FIG. 1.

The memory controller 6220 may control the operations, including the read, write and erase operations for the memory device 6230 in response to requests received from a host 6210. The memory controller 6220 may include a central processing unit (CPU) 6221, a random access memory (RAM) as a buffer memory 6222, an error correction code (ECC) circuit 6223, a host interface 6224, and an NVM interface as a memory interface 6225, all coupled via an internal bus.

The CPU 6221 may control the operations for the memory device 6230 such as read, write, file system management, bad page management, and so forth. The RAM 6222 may operate according to control of the CPU 6221, and may be used as a work memory, a buffer memory, a cache memory, or the like. In the case where the RAM 6222 is used as a work memory, data processed by the CPU 6221 is temporarily stored in the RAM 6222. In the case where the RAM 6222 is used as a buffer memory, the RAM 6222 is used to buffer data to be transmitted from the host 6210 to the memory device 6230 or from the memory device 6230 to the host 6210. In the case where the RAM 6222 is used as a cache memory, the RAM 6222 may be used to enable the memory device 6230 with a low speed to operate at a high speed.

The ECC circuit 6223 corresponds to the ECC unit 138 of the controller 130 described above with reference to FIG. 1. As described above with reference to FIG. 1, the ECC circuit 6223 may generate an error correction code (ECC) for correcting a fail bit or an error bit in the data received from the memory device 6230. The ECC circuit 6223 may perform error correction encoding for data to be provided to the memory device 6230, and may generate data added with parity bits. The parity bits may be stored in the memory device 6230. The ECC circuit 6223 may perform error correction decoding for data outputted from the memory device 6230. At this time, the ECC circuit 6223 may correct errors by using the parity bits. For example, as described above with reference to FIG. 1, the ECC circuit 6223 may correct errors by using various coded modulations such as of a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM) and a Block coded modulation (BCM).

The memory controller 6220 transmits and receives data to and from the host 6210 through the host interface 6224, and transmits and receives data to and from the memory device 6230 through the NVM interface 6225. The host interface 6224 may be connected with the host 6210 through at least one of various interface protocols such as a parallel advanced technology attachment (PATA) bus, a serial advanced technology attachment (SATA) bus, a small computer system interface (SCSI), a universal serial bus (USB), a peripheral component interconnection express (PCIe) or a NAND interface. Further, as a wireless communication function or a mobile communication protocol such as wireless fidelity (WI-FI) or long term evolution (LTE) is realized, the memory controller 6220 may transmit and receive data by being connected with an external device such as the host 6210 or another external device other than the host 6210. Specifically, as the memory controller 6220 is configured to communicate with an external device through at least one among various communication protocols, the memory system and the data processing system according to the embodiment may be applied to wired/wireless electronic appliances, For example, a mobile electronic appliance.

Figure 9:
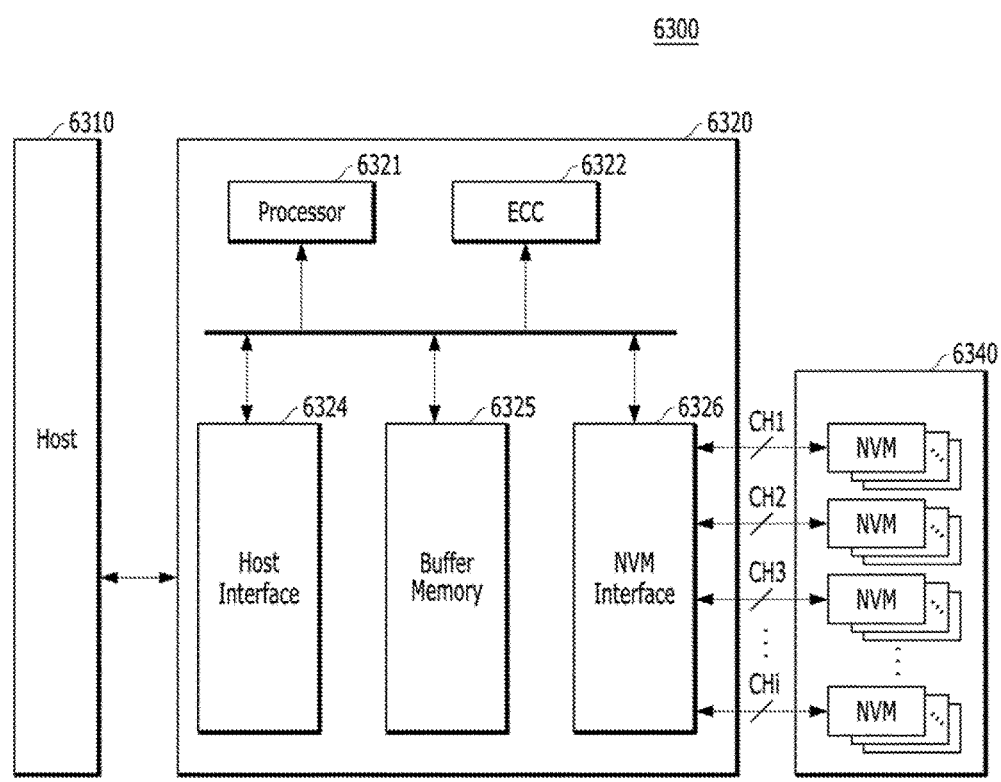

FIG. 9 is a diagram illustrating an example of a data processing system including a memory system according to an embodiment of the invention. FIG. 9 may be a solid state drive (SSD).

Referring to FIG. 9, an SSD 6300 may include a memory device 6340 which may include a plurality of nonvolatile memories NVM, and a controller 6320. The controller 6320 may correspond to the controller 130 in the memory system 110 described above with reference to FIG. 1, and the memory device 6340 may correspond to the memory device 150 in the memory system 110 described above with reference to FIG. 1.

In detail, the controller 6320 may be connected with the memory device 6340 through a plurality of channels CH1, CH2, CH3, . . . and CHi. The controller 6320 may include a processor 6321, a buffer memory 6325, an error correction code (ECC) circuit 6322, a host interface 6324, and a nonvolatile memory (NVM) interface as a memory interface 6326 coupled via an internal bus.

The buffer memory 6325 temporarily stores data received from a host 6310 or data received from a plurality of nonvolatile memories NVMs included in the memory device 6340, or temporarily stores metadata of the plurality of nonvolatile memories NVMs. For example, the metadata may include map data including mapping tables. The buffer memory 6325 may be implemented with a volatile memory such as, but not limited to, a dynamic random access memory (DRAM), a synchronous dynamic random access memory (SDRAM), a double data rate (DDR) SDRAM, a low power double data rate (LPDDR) SDRAM and a graphic random access memory (GRAM) or a nonvolatile memory such as, but not limited to, a ferroelectric random access memory (FRAM), a resistive random access memory (ReRAM), a spin-transfer torque magnetic random access memory (STT-MRAM) and a phase change random access memory (PRAM). While it is illustrated in FIG. 9, for the sake of convenience in explanation, that the buffer memory 6325 is disposed inside the controller 6320, it is to be noted that the buffer memory 6325 may be disposed outside the controller 6320.

The ECC circuit 6322 calculates error correction code values of data to be programmed in the memory device 6340 in a program operation, performs an error correction operation for data read from the memory device 6340, based on the error correction code values, in a read operation, and performs an error correction operation for data recovered from the memory device 6340 in a recovery operation for failed data.

The host interface 6324 provides an interface function with respect to an external device such as the host 6310. The nonvolatile memory interface 6326 provides an interface function with respect to the memory device 6340 which is connected through the plurality of channels CH1, CH2, CH3, . . . and CHi.

As a plurality of SSDs 6300 to each of which the memory system 110 described above with reference to FIG. 1 is applied are used, a data processing system such as a redundant array of independent disks (RAID) system may be implemented. In the RAID system, the plurality of SSDs 6300 and an RAID controller for controlling the plurality of SSDs 6300 may be included. In the case of performing a program operation by receiving a write command from the host 6310, the RAID controller may select at least one memory system (For example, at least one SSD 6300) in response to the RAID level information of the write command received from the host 6310, among a plurality of RAID levels (for example, the plurality of SSDs 6300) and may output data corresponding to the write command, to the selected SSD 6300. In the case of performing a read operation by receiving a read command from the host 6310, the RAID controller may select at least one memory system (For example, at least one SSD 6300) in response to the RAID level information of the write command received from the host 6310, among the plurality of RAID levels (for example, the plurality of SSDs 6300), and may provide data outputted from the selected SSD 6300, to the host 6310.

Figure 10:
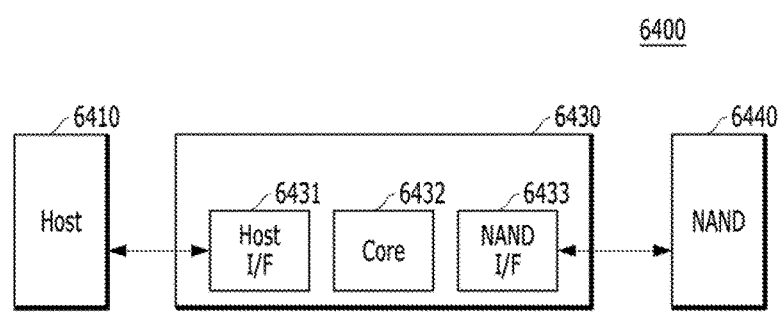

FIG. 10 is a diagram illustrating another example of a data processing system including the memory system according to an embodiment of the present invention. FIG. 10 is a drawing schematically illustrating an embedded multimedia card (eMMC) to which a memory system according to an embodiment is applied.

Referring to FIG. 10, an eMMC 6400 includes a memory device 6440 which is implemented with at least one NAND flash memory, and a controller 6430. The controller 6430 may correspond to the controller 130 in the memory system 110 described above with reference to FIG. 1, and the memory device 6440 may correspond to the memory device 150 in the memory system 110 described above with reference to FIG. 1.

In detail, the controller 6430 may be connected with the memory device 6440 through a plurality of channels. The controller 6430 may include a core 6432, a host interface 6431, and a memory interface such as a NAND interface 6433.

The core 6432 may control the operations of the eMMC 6400. The host interface 6431 may provide an interface function between the controller 6430 and a host 6410. The NAND interface 6433 may provide an interface function between the memory device 6440 and the controller 6430. For example, the host interface 6431 may be a parallel interface such as an MMC interface, as described above with reference to FIG. 1, or a serial interface such as an ultra-high speed class 1 (UHS-I)/UHS class 2 (UHS-II) and a universal flash storage (UFS) interface.

Figure 11:
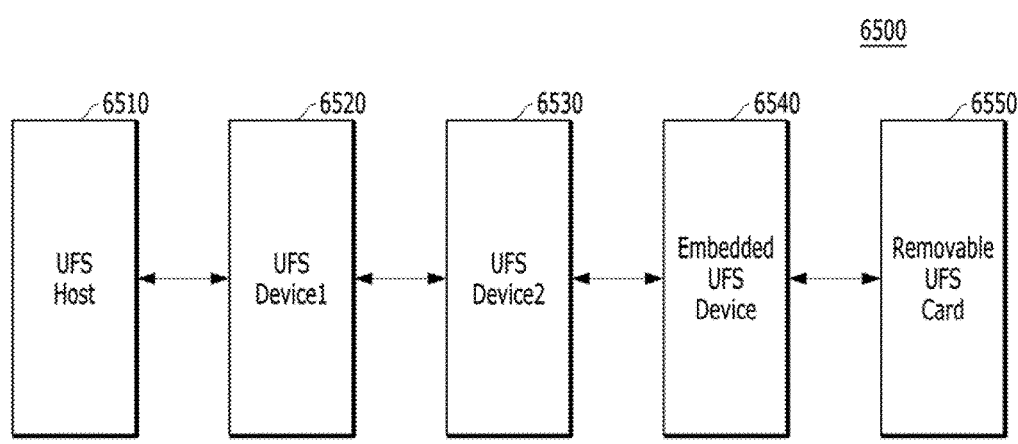

FIG. 11 is a diagram illustrating another example of a data processing system including a memory system according to an embodiment of the present invention. FIG. 10 is a drawing schematically illustrating a universal flash storage (UFS) to which the memory system according to the embodiment is applied.

Referring to FIG. 11, a UFS system 6500 may include a UFS host 6510, a plurality of UFS devices 6520 and 6530, an embedded UFS device 6540, and a removable UFS card 6550. The UFS host 6510 may be an application processor of wired/wireless electronic appliances, for example, a mobile electronic appliance.

The UFS host 6510, the UFS devices 6520 and 6530, the embedded UFS device 6540 and the removable UFS card 6550 may respectively communicate with external devices such as wired/wireless electronic appliances (for example, a mobile electronic appliance), through a UFS protocol. The UFS devices 6520 and 6530, the embedded UFS device 6540 and the removable UFS card 6550 may be implemented with the memory system 110 described above with reference to FIG. 1, for example, as the memory card system 6100 described above with reference to FIG. 7. The embedded UFS device 6540 and the removable UFS card 6550 may communicate through another protocol other than the UFS protocol. For example, the embedded UFS device 6540 and the removable UFS card 6550 may communicate through various card protocols such as, but not limited to, USB flash drives (UFDs), multimedia card (MMC), secure digital (SD), mini SD and Micro SD.

Figure 12:
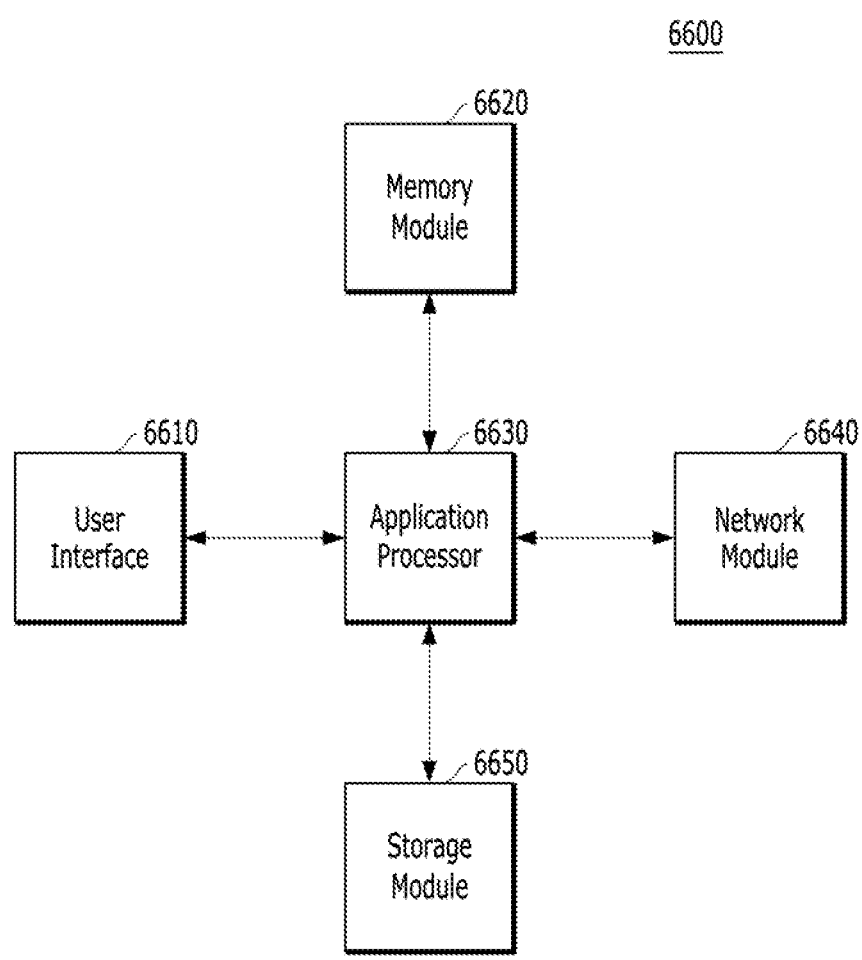

FIG. 12 is a diagram illustrating an example of a data processing system including the memory system according to an embodiment of the present invention. FIG. 12 is a drawing schematically illustrating a user system to which the memory system according to the embodiment is applied.

Referring to FIG. 12, a user system 6600 may include an application processor 6630, a memory module 6620, a network module 6640, a storage module 6650, and a user interface 6610.

The application processor 6630 may drive components included in the user system 6600 and an operating system (OS). For example, the application processor 6630 may include controllers for controlling the components included in the user system 6600, interfaces, graphics engines, and so on. The application processor 6630 may be provided by a system-on-chip (SoC).

The memory module 6620 may operate as a main memory, a working memory, a buffer memory or a cache memory of the user system 6600. The memory module 6620 may include a volatile random access memory such as a dynamic random access memory (DRAM), a synchronous dynamic random access memory (SDRAM), a double data rate (DDR) SDRAM, a DDR2 SDRAM, a DDR3 SDRAM, a low power double data rate (LPDDR) SDRAM, an LPDDR2 SDRAM and an LPDDR3 SDRAM or a nonvolatile random access memory such as a phase change random access memory (PRAM), a resistive random access memory (ReRAM), a magnetic random access memory (MRAM) and a ferroelectric random access memory (FRAM). For example, the application processor 6630 and the memory module 6620 may be mounted by being packaged on the basis of a package-on-package (POP).

The network module 6640 may communicate with external devices. For example, the network module 6640 may support not only wired communications but also various wireless communications such as code division multiple access (CDMA), global system for mobile communication (GSM), wideband CDMA (WCDMA), CDMA-2000, time division multiple access (TDMA), long term evolution (LTE), worldwide interoperability for microwave access (WiMAX), wireless local area network (WLAN), ultra-wideband (UWB), Bluetooth, wireless display (WI-DI), and so on, and may thereby communicate with wired/wireless electronic appliances, For example, a mobile electronic appliance. According to this fact, the memory system and the data processing system according to the embodiment may be applied to wired/wireless electronic appliances. The network module 6640 may be included in the application processor 6630.

The storage module 6650 may store data such as data received from the application processor 6530, and transmit data stored therein, to the application processor 6530. The storage module 6650 may be realized by a nonvolatile semiconductor memory device such as a phase-change RAM (PRAM), a magnetic RAM (MRAM), a resistive RAM (ReRAM), a NAND flash memory, a NOR flash memory and a 3-dimensional NAND flash memory. The storage module 6650 may be provided as a removable storage medium such as a memory card of the user system 6600 and an external drive. For example, the storage module 6650 may correspond to the memory system 110 described above with reference to FIG. 1, and may be implemented with the SSD, eMMC and UFS described above with reference to FIGS. 9 to 11.

The user interface 6610 may include interfaces for inputting data or commands to the application processor 6630 or for outputting data to an external device. For example, the user interface 6610 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, a light emitting diode (LED), a speaker and a motor.

In the case where the memory system 110 described above with reference to FIG. 1 is applied to the mobile electronic appliance of the user system 6600 according to an embodiment, the application processor 6630 may control the operations of the mobile electronic appliance, and the network module 6640 as a communication module may control wired/wireless communication with an external device, as described above. The user interface 6610 as the display/touch module of the mobile electronic appliance displays data processed by the application processor 6630 or supports input of data from a touch panel.

The memory system and the operating method thereof according to the embodiments may minimize complexity and performance deterioration of the memory system and maximize use efficiency of a memory device, thereby quickly and stably process data with respect to the memory device.

Although various embodiments have been described for illustrative purposes, it will be apparent to those skilled in the art that various changes and modifications may be made without departing from the spirit and scope of the invention as defined in the following claims.

What is claimed is:

1. A method for operating a memory system, comprising:
    performing a program operation corresponding to a write command received from a host, at a first point of time, with respect to first memory blocks among a plurality of memory blocks, for a plurality of pages which are included in the plurality of memory blocks of a memory device and which include a plurality of memory cells coupled to a plurality of word lines;
    checking program information for the program operation at the first point of time;
    predicting erase information on the memory blocks in correspondence to the program information;
    recording the erase information in a list;
    performing a multi-block erase operation for at least two second memory blocks among the memory blocks, at a second point of time next to the first point of time, in correspondence to the erase information predicted and recorded; and performing the program operation for the second memory blocks at a third point of time next to the second point of time,
wherein the list is constituted with a plurality of rows, each corresponding to each of the at least two second memory blocks, and a plurality of columns, each corresponding to each memory block included in the at least two second memory blocks; and
wherein the controller comprises a buffer storing the list segregated from data segments, L2P segments, and P2L segments.

2. The method according to claim 1, wherein the predicting comprises:
predicting the second memory blocks for which it is necessary to perform the erase operation, in order to perform the program operation at the third point of time in correspondence to the program information; and
recording the erase information for the second memory blocks, in a list.

3. The method according to claim 2, wherein indexes or identification information of the second memory blocks, which indicate necessity to perform the erase operation through the multi-block erase operation, are included in the list.

4. The method according to claim 2, wherein the program operation is performed, through one-shot program, for pages of super memory blocks which include the memory blocks.

5. The method according to claim 4, wherein the list includes rows respectively corresponding to the super memory block and bit areas corresponding to memory blocks of the respective super memory blocks, in the rows of the super memory blocks.

6. The method according to claim 5, wherein the recording records erase information, in the form of a bit map, regarding respective memory blocks of a first super memory block corresponding to a first row into a first bit area and a second bit area of the first row of the list.

7. The method according to claim 6, wherein the erase information includes information indicating the erase operation for the second memory blocks, in correspondence to the change from the first memory blocks to the second memory blocks.

8. A memory system comprising:
a memory device including a plurality of pages which include a plurality of memory cells coupled with a plurality of word lines and are stored with data, a plurality of memory blocks in which the pages are included, a plurality of planes which include the memory blocks, and a plurality of memory dies in which the planes are included; and
a controller suitable for: performing a program operation corresponding to a write command received from a host, at a first point of time, for first memory blocks among the memory blocks; checking program information for the program operation at the first point of time; predicting erase information on the memory blocks in correspondence to the program information; recording the erase information in a list; performing a multi-block erase operation for at least two second memory blocks among the memory blocks, at a second point of time after the first point of time, in correspondence to the erase information predicted and recorded; and performing the program operation for the second memory blocks at a third point of time after the second point of time,
wherein the list is constituted with a plurality of rows, each corresponding to each of the at least two second memory blocks, and a plurality of columns, each corresponding to each memory block included in the at least two second memory blocks; and
wherein the controller comprises a buffer storing the list segregated from data segments, L2P segments, and P2L segments.

9. The memory system according to claim 8, wherein, in order to perform the program operation at the third point of time in correspondence to the program information, the controller predicts the second memory blocks for which it is necessary to perform the erase operation, and records the erase information for the second memory blocks, in a list.

10. The memory system according to claim 9, wherein indexes or identification information of the second memory blocks, which indicate necessity to perform the erase operation through the multi-block erase operation, are included in the list.

11. The memory system according to claim 9, wherein the controller performs the program operation, through a one-shot program, for pages of super memory blocks which include the memory blocks.

12. The memory system according to claim 11, wherein the list includes rows respectively corresponding to the super memory blocks and bit areas corresponding to memory blocks of the respective super memory blocks, in the rows of the super memory blocks.

13. The memory system according to claim 12, wherein the controller records erase information, in the form of a bit map, regarding respective memory blocks of a first super memory block corresponding to a first row into a first bit area and a second bit area of the first row of the list.

14. The memory system according to claim 13, wherein the erase information includes information indicating the erase operation for the second memory blocks, in correspondence to the change from the first memory blocks to the second memory blocks.

* * * * *